United States Patent [19]
Mineji

[11] Patent Number: 5,567,959
[45] Date of Patent: Oct. 22, 1996

[54] LAMINATED COMPLEMENTARY THIN FILM TRANSISTOR DEVICE WITH IMPROVED THRESHOLD ADAPTABILITY

[75] Inventor: Akira Mineji, Tokyo, Japan

[73] Assignee: NEC Corporation, Tokyo, Japan

[21] Appl. No.: 356,558

[22] Filed: Dec. 15, 1994

[30] Foreign Application Priority Data

Dec. 27, 1993 [JP] Japan ................................. 5-333208

[51] Int. Cl.6 ..................... H01L 27/108; H01L 29/76; H01L 27/01
[52] U.S. Cl. .................. 257/69; 257/67; 257/350; 257/351; 257/365; 257/366
[58] Field of Search ........................ 257/66, 67, 69, 257/350, 351

[56] References Cited

U.S. PATENT DOCUMENTS 5,162,889  11/1992  Itomi .................................... 257/69
5,266,507  11/1993  Wu ....................................... 257/66
5,428,238   6/1995  Hayashi et al. ........................ 257/69

FOREIGN PATENT DOCUMENTS

63-119578   5/1988  Japan .
63-102264   5/1988  Japan ................................... 257/67
1-246863   10/1989  Japan .
2-109359    4/1990  Japan ................................... 257/67

Primary Examiner—Mahshid Saadat
Attorney, Agent, or Firm—Popham, Haik, Schnobrich & Kaufman, Ltd.

[57] ABSTRACT

A combination of a lower thin film transistor formed on an insulating substrate and an upper thin film transistor laminated over the lower transistor has a lower channel formed in the lower transistor, an upper channel formed in the upper transistor, a lower gate electrode disposed under the lower channel, an intermediate gate electrode disposed between the lower channel and the upper channel, and an upper gate electrode disposed over the upper channel.

10 Claims, 6 Drawing Sheets

LAMINATED COMPLEMENTARY THIN FILM TRANSISTOR DEVICE WITH IMPROVED THRESHOLD ADAPTABILITY

BACKGROUND OF THE INVENTION

The present invention relates to a laminated complementary thin film transistor device, and particularly to a laminated complementary thin film transistor device with an improved threshold adaptability for use as an element of a liquid crystal display, an SRAM load or the like.

Description of the Related Art

There had been observed undesirable variations in value of a threshold voltage (hereinafter referred to "Vth") of a complementary thin film transistor (hereinafter referred to "TFT") in a thin film transistor device, whether the TFT was an n-channel type or a p-channel type, due to some fabrication processes thereof. Particularly, in employment of a silicon nitride film deposited after a plasma processing there had been observed a variety of significantly shifted Vth values, giving rise to a tendency that a depression type element or an enhancement type element would exhibit, so that a drain current Id might have its off-value $I_{off}$ disadvantageously increased with a controlled gate voltage Vg=0 V, causing a hindrance to an associated circuit function of the device.

In the thin film transistor device, the TFT was formed on an insulating substrate so that it had a channel region thereof biased with a floating or unfixed potential, inherently needing an implementation for a desired control of the Vth value.

Figure 1:
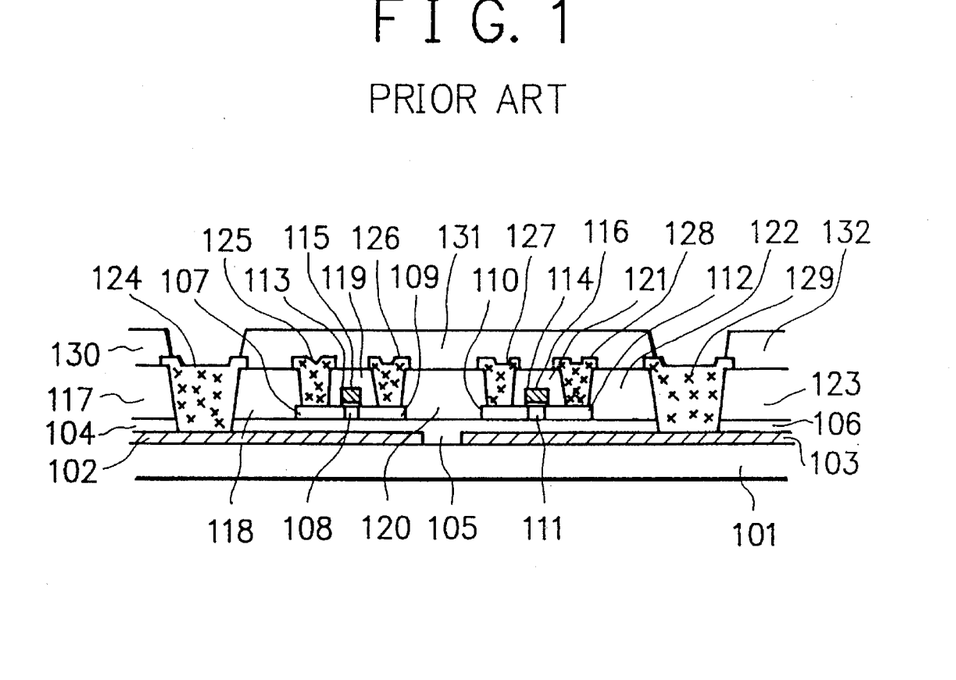
FIG. 1 is a transverse section of a conventional semiconductor device.
Figure 2:
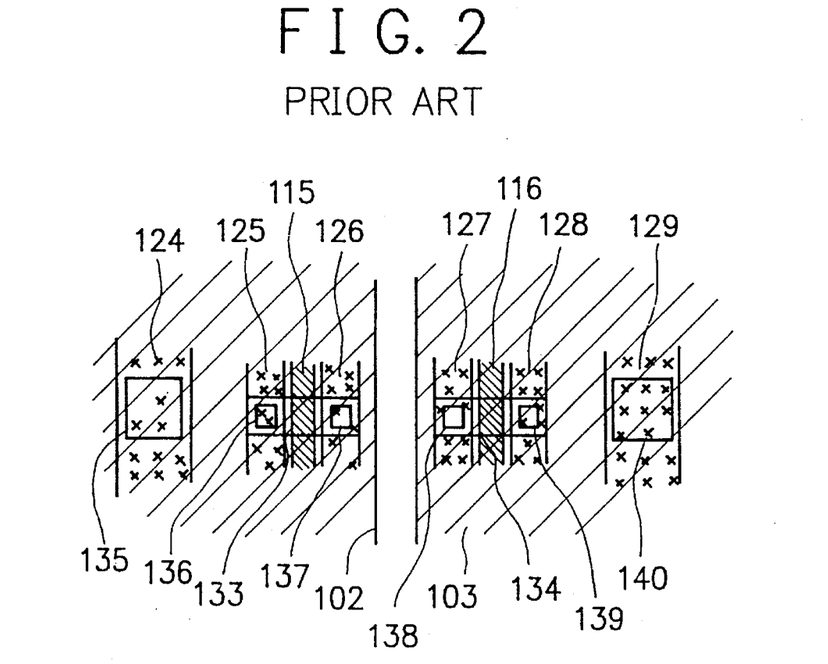
FIG. 2 is a perspective sectional view from the bottom of the semiconductor device of FIG. 1.

As a conventional example of that implementation, the Japanese Patent Application Laid-Open Publication No. 63(1988)-119578 has disclosed a semiconductor device with an internal structure illustrated in FIG. 1 as a transverse section thereof and in FIG. 2 as a perspective sectional view from the bottom thereof. The semiconductor device includes an insulating substrate 101 extending in a longitudinal direction (the vertical direction in FIG. 2) and a transverse direction (the lateral direction in the same figure), a conductive layer consisting of a plurality of longitudinally extending (cross hatched) separate portions 102 and 103 formed on the substrate 101, and an insulating layer designated by numerals 104, 105 and 106 in FIG. 1. The insulating layer is formed over the conductive layer and has a plurality of square contact holes 135, 136, 137, 138, 139 and 140 formed therethrough. On the insulating layer are formed a plurality of transistor groups each respectively consisting of a plurality of longitudinally spaced pairs of TFTs which are transversely spaced apart from each other to be disposed above corresponding ones 102 and 103 of the conductive separate portions. Each TFT is constituted with a combination 107, 109 or 110, 112 of a source electrode and a drain electrode both formed as a film 133 or 134 on the insulating layer, a channel 108 or 111 formed between the source electrode and the drain electrode, an insulating film 113 or 114 formed on the channel 108 or 111, and a (fine hatched) gate electrode 115 or 116 formed on the insulating film 113 or 114. The semiconductor device further includes an interlayer insulating film designated by numerals 117, 118, 119, 120, 121, 122 and 123, a protection film designated by numerals 130, 131 and 132, and a plurality of longitudinally extending wiring conductors 124, 125, 126, 127, 128 and 129. In the structure described, the conductive separate portions 102 and 103 have their potentials controlled for adaptation of Vth values at the channels 108 and 111, respectively. However, this conventional example needs a plurality of contact arrays provided for the conductive separate portions 102 and 103, in addition to the required provision of two-dimensionally arranged TFTs, thus resulting in a difficulty of achieving an effectively reduced total circuit area.

Figure 3:
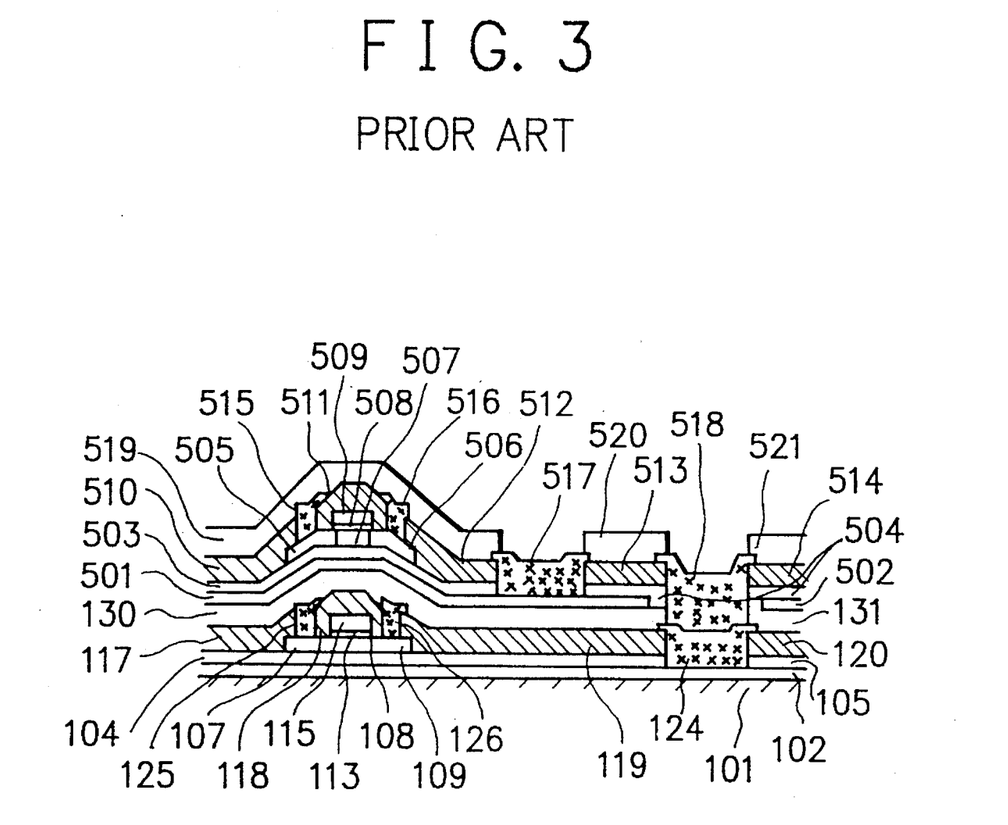
FIG. 3 is a transverse section of a conventional integrated circuit.

As another conventional example to overcome this problem, the Publication No. 63(1988)-119578 has further disclosed a three-dimensionally integrated circuit of a laminated structure illustrated in FIG. 3 as a transverse section thereof. In FIG. 3, like reference numerals to FIGS. 1 and 2 designate like or corresponding parts to the former or first conventional example. The integrated circuit according to the latter or second conventional example includes an insulating substrate 101, a lower conductive layer 102 formed on the substrate 101, and a lower insulating layer formed on the conductive layer 102 and designated by numerals 104 and 105. On the lower insulating layer is formed a lower transistor array consisting of a plurality of longitudinally spaced lower TFTs. Each lower TFT is constituted with a combination 107, 109 of a source electrode and a drain electrode both formed on the lower insulating layer, a channel 108 formed between the source electrode and the drain electrode, an insulating film 113 formed on the channel 108, and a gate electrode 115 formed on the insulating film 113. The integrated circuit further includes a (hatched) lower interlayer insulating film designated by numerals 117, 118, 119 and 120, a lower protection film designated by numerals 130 and 131, and a plurality of longitudinally extending lower wiring conductors 124, 125 and 126. The integrated circuit still further includes an upper conductive layer formed on the lower protection film and designated by numerals 501 and 502, and an upper insulating layer formed on the upper conductive layer and designated by numerals 503 and 504. On the upper insulating layer is formed an upper transistor array consisting of a plurality of longitudinally spaced upper TFTs. Each upper TFT is constituted with a combination 505, 506 of a source electrode and a drain electrode both formed on the upper insulating layer, a channel 507 formed between the source electrode and the drain electrode, an insulating film 508 formed on the channel 507, and a gate electrode 509 formed on the insulating film 508. The integrated circuit yet further includes a (shadowed) upper interlayer insulating film designated by numerals 510, 511, 512, 513 and 514, an upper protection film designated by numerals 519, 520 and 521, and a plurality of longitudinally extending upper wiring conductors 515, 516, 517 and 518. Also in the laminated structure described, the upper and lower conductive layers have their potentials controlled for adaptation of Vth values at the channels 507 and 108 of the upper and lower TFTs, respectively. The second conventional example however needs twice as many fabrication processes as the first conventional example, even in a simply adding estimation. Moreover, the required formation of upper TFTs to be entered after completion of a wiring process for lower TFTs includes some difficulties such as to avoid giving adverse thermal effects on wiring conductors of the lower TFTs.

Figure 4:
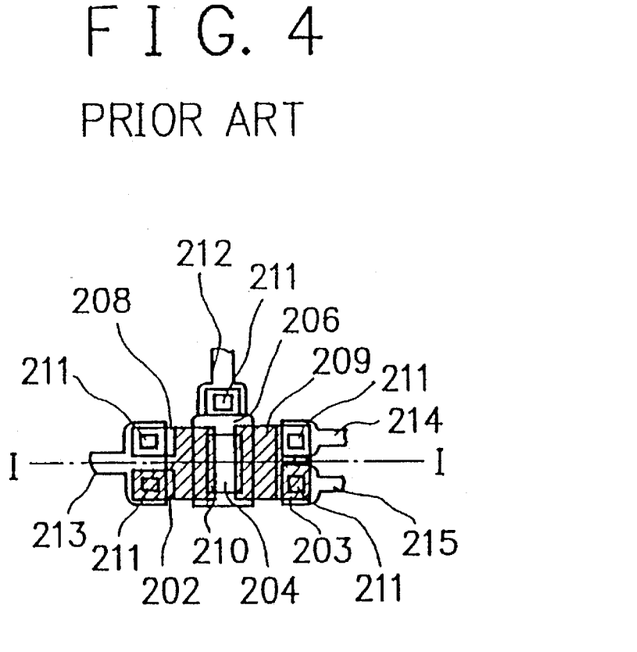
FIG. 4 is a perspective bottom view of an essential portion of a conventional CMOS inverter.
Figure 5:
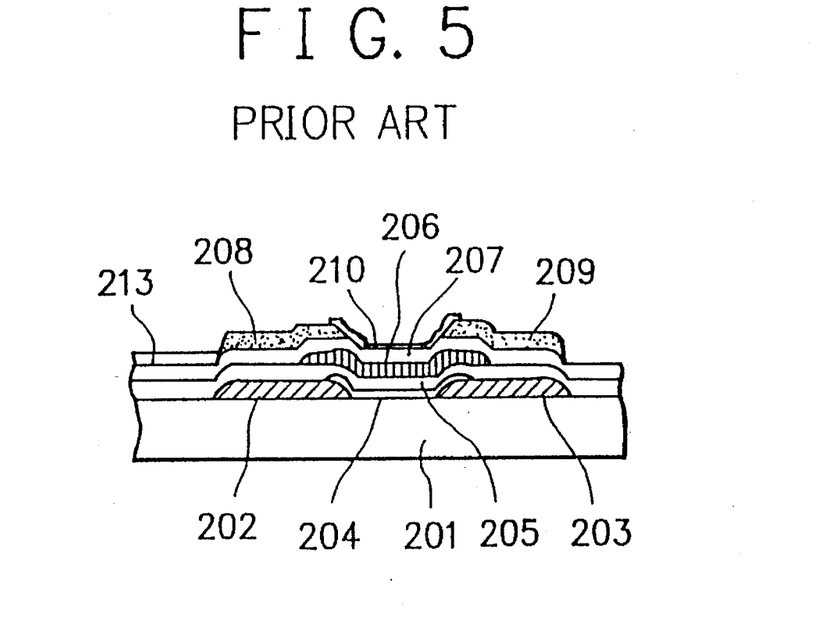
FIG. 5 is a section of the CMOS inverter along line I—I of FIG. 4.

As still another conventional example to overcome such problems, the Japanese Patent Application Laid-Open Publication No. 1(1989)-246863 has disclosed a semiconductor device constituted as a CMOS inverter of a simple laminated structure illustrated in FIGS. 4 and 5 and a production method thereof. FIG. 4 is a perspective bottom view of an essential portion of the inverter, and FIG. 5 is a section thereof along line I—I of FIG. 4. The CMOS inverter according to the third conventional example includes an insulating substrate 201, and a pair of upper and lower TFTs laminated thereover with a (fine hatched) common gate electrode 206 interposed therebetween. The lower TFT is of an n-channel type having a (cross hatched) source electrode 202 thereof formed on the substrate 201, a (cross hatched) drain electrode 203 thereof formed on the substrate 201 in a transversely spaced location from the source electrode 202, and a channel 204 thereof formed between the source and drain electrodes 202 and 203. Over the channel 204 of the lower TFT is formed a lower gate-insulating film 205 on which the gate electrode 206 is formed. Over the gate electrode 206 is formed an upper gate-insulating film 207. The upper TFT is of a p-channel type having a channel 210 thereof formed on the upper gate-insulating film 207, and a (dotted) source electrode 208 and a (dotted) drain electrode 209 thereof formed either at both sides of the channel 210 in staggered locations from the source and drain electrodes 202 and 203 of the lower TFT, respectively. The CMOS inverter further includes a plurality of contact holes 211, an input conductor 212, an output conductor 218, and a pair of power supply conductors 214 and 215. According to the third conventional example, a simplified structure effectively permits a facilitated production. However, the desideratum for a desired adaptation of Vth value may be ineffectively achieved. Further, a leakage current may adversely affect the performance of circuitry. An improvement of the third conventional example to achieve a desired adaptation of Vth value while securing required levels of on/off currents would require a number of problems to be concurrently solved such as for a simplified production process, an optimal combination of the size and film thickness of n-type and p-type channels, a flexible controllability of Vth value and an effectively reduced leakage current.

SUMMARY OF THE INVENTION

It is an object of the present invention to provide a complementary thin film transistor device of a laminated structure with an improved threshold adaptability, as a solution to the problems described.

To achieve the object, the present invention provides a laminated complementary thin film transistor device comprising an insulating substrate, and a combination of a lower thin film transistor formed on the substrate and an upper thin film transistor laminated over the lower transistor, the lower transistor and the upper transistor having a lower channel and an upper channel formed therein, respectively, a lower gate electrode disposed under the lower channel, an intermediate gate electrode disposed between the lower channel and the upper channel, and an upper gate electrode disposed over the upper channel.

According to the present invention, therefore, in a laminated complementary thin film transistor device, a pair of vertically spaced channels are interposed either between a lower gate electrode and an intermediate gate electrode and the other between the intermediate gate electrode and an upper gate electrode, so that electric potentials developed around the respective gate electrodes in operation of the thin film transistor device are effectively controllable for a desired adaptation of Vth value at each of the channels.

According to a species of the present invention, the lower channel and the upper channel are formed either as an n-type channel and the other as a p-type channel.

According to another species of the present invention, the intermediate gate electrode is a common gate electrode to the lower transistor and the upper transistor.

According to a species of the present invention, therefore, a laminated complementary thin film transistor device may have an effectively reduced number of components, permitting a simplified structure with a reduced integration size and a favorably reduced number of fabrication processes. The whole production process may also be facilitated.

According to another species of the present invention, the intermediate gate electrode is formed as a substantially exclusive gate electrode for the lower transistor, and another intermediate gate electrode is formed as a substantially exclusive gate electrode for the upper transistor.

According to another species of the present invention, the intermediate gate electrode is formed as a substantially exclusive gate electrode for the upper transistor, and another intermediate gate electrode is formed as a substantially exclusive gate electrode for the lower transistor.

According to another species of the present invention, the lower transistor comprises the lower gate electrode formed on the insulating substrate, a gate insulating film deposited on the lower gate electrode, a semiconductive layer including the lower channel, the semiconductive layer being deposited on the gate insulating film, another gate insulating film formed on the semiconductive layer, and the intermediate gate electrode formed on this gate insulating film. The semiconductive layer may further include a source electrode and a drain electrode, and the intermediate gate electrode may preferably have an overlapping size or an offset size with respect to the lower gate electrode.

According to another species of the present invention, the upper transistor comprises the intermediate gate electrode formed on the lower transistor with an insulating film interposed therebetween, a gate insulating film deposited on the intermediate gate electrode, a semiconductive layer including the upper channel, the semiconductive layer being deposited on the gate insulating film, another gate insulating film formed on the semiconductive layer, and the upper gate electrode formed on this gate insulating film. The semiconductive layer may further include a source electrode and a drain electrode, and the upper gate electrode may preferably have an overlapping size or an offset size with respect to the intermediate gate electrode.

According to a species of the present invention, therefore, a laminated complementary thin film transistor device may have an increased controllability for a desired adaptation of Vth value, as well as an improved geometry for securing a desirable current level.

BRIEF DESCRIPTION OF THE DRAWINGS

The objects, features and advantages of the present invention will become more apparent from consideration of the following detailed description of preferred embodiments thereof, taken in conjunction with the accompanying drawings, in which.

DESCRIPTION OF THE PREFERRED EMBODIMENTS

There will be detailed below preferred embodiments of the present invention, with reference to FIGS. 6 to 10.

Figure 6:
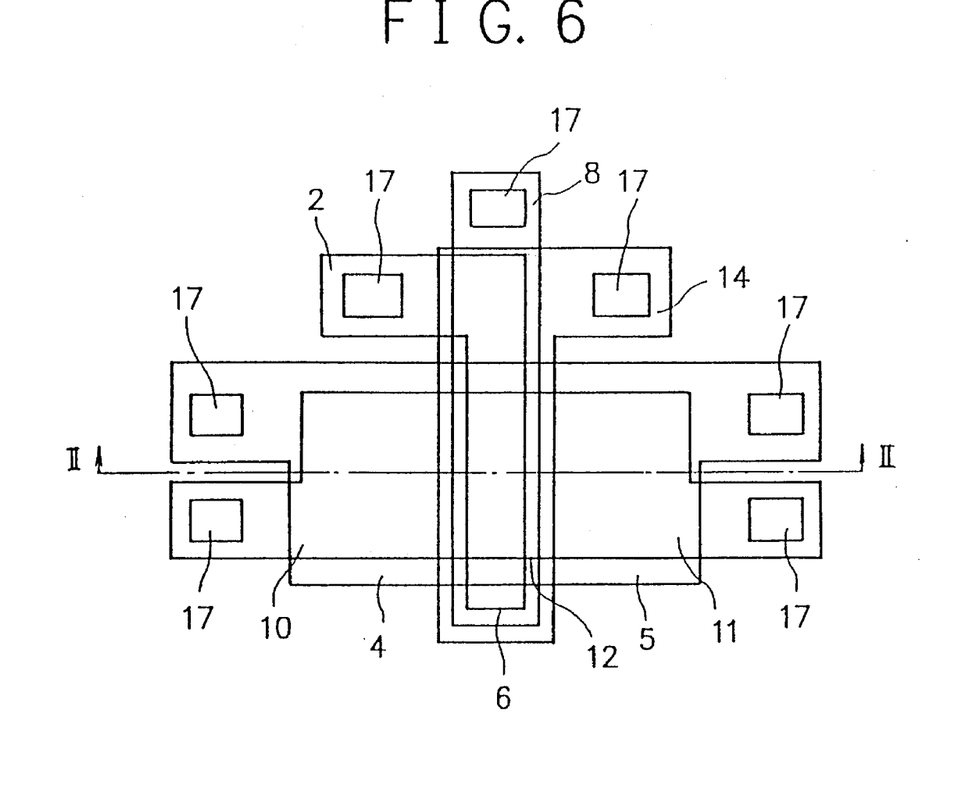
FIG. 6 is a perspective top view of an essentail portion of a laminated complementary thin film transistor device according to a first embodiment of the present invention.
Figure 7:
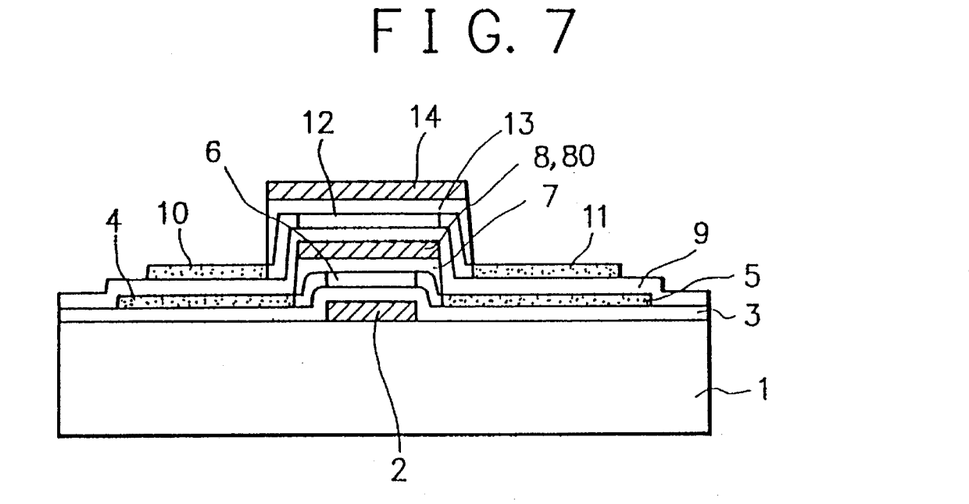
FIG. 7 is a section of the thin film transistor device along line II—II of FIG. 6.

FIGS. 6 and 7 show the internal structure of a laminated complementary thin film transistor device according to a first embodiment of the present invention. The thin film transistor comprises an insulating substrate 1, and a combination of a lower thin film transistor (or lower TFT) formed on the insulating substrate 1 and an upper thin film transistor (or upper TFT) laminated over the lower transistor. The lower TFT comprises a lower gate electrode 2 formed on the insulating substrate 1, a gate insulating film 3 deposited on the lower gate electrode 2, and a later-described lower semiconductive layer including a lower source electrode 4, a lower drain electrode 5 and a lower channel 6 formed as a p-type in which a positive hole constitutes a majority carrier.

The lower semiconductive layer is deposited on the gate insulating film 3. On the lower semiconductive layer is formed another gate insulating film 7 on which a vertically intermediate gate electrode 8 is formed. The upper TFT comprises the intermediate gate electrode 8, a gate insulating film 9 deposited on the intermediate gate electrode 8, a later-described upper semiconductive layer including an upper source electrode 10, an upper drain electrode 11 and an upper channel 12 formed as an n-type in which an electron constitutes a majority carrier. The upper semiconductive layer is deposited on the gate insulating film 9. On the upper semiconductive layer is formed another gate insulating film 13 on which an upper gate electrode 14 is formed. The upper gate electrode 14 is formed as a top gate constituting the upper TFT.

Letting the extending direction (in FIG. 6) of the intermediate gate electrode 8 be a longitudinal direction of the thin film transistor device and that of the source and drain electrodes 4,10 and 5,11 be a transverse or left-or-right direction of the device, the lower gate electrode 2 has a leftwardly angled configuration consisting of a longitudinally extending relatively narrow (in comparison with the intermediate gate electrode 8) trunk and a leftwardly extending end portion formed with a square contact hole 17, and the upper gate electrode 14 has a rightwardly angled configuration consisting of a longitudinally extending relatively wide (in comparison with the intermediate gate electrode 8) trunk and a rightwardly extending end portion formed with a square contact hole 17. The intermediate gate electrode 8 has a straight configuration formed with a square contact hole 17 in a projecting end portion thereof beyond the lower and upper gate electrodes 2 and 14. The gate electrodes 2, 8 and 14 have their trunks overlapping on each other with their longitudinal centerlines coincident. The lower source electrode 4 and the lower drain electrode 5 are arranged either on both sides of the trunk of the intermediate gate electrode 8, in a plan thereof, and each respectively constituted with a relatively large substantially square body and a longitudinally width-reduced leftwardly or rightwardly extending end portion formed with a square contact hole 17. The upper source electrode 10 and the upper drain electrode 11 are arranged either on both sides of the trunk of the upper gate electrode 14, in a plan thereof, and each respectively constituted with a relatively small substantially square body and a longitudinally width-reduced leftwardly or rightwardly extending end portion formed with a square contact hole 17. The lower and upper source electrodes 4 and 10 have their bodies overlapping on each other with their transverse centerlines coincident, as well as the lower and upper drain electrodes 5 and 11. The end portions of the lower and upper source electrodes 4 and 10 are arranged in a longitudinally spaced manner from each other in a plan view, like those of the lower and upper drain electrodes 5 and 11.

As shown in FIG. 7, the gate insulating films 3 and 9 have their transversely central portions trapezoidally or substantially parallelogramically raised to accommodate therein the lower gate electrode 2 and a combination of the gate insulating film 7 and the intermediate gate electrode 8 formed thereon, respectively. Also the gate insulating film 7 has a trapezoidal transverse section for accommodating therein the lower channel 6, like the gate insulating film 13 accommodating therein the upper channel 12.

The lower channel 6 and the upper channel 12 may be constituted either as an n-type and the other as a p-type, or alternatively both as an n-type or as a p-type.

The lower semiconductive layer is formed on the gate insulating film 3, as a continuous film when deposited thereon, and as a combination of predetermined patterns (constituting the source electrode 4, the drain electrode 5 and the lower channel 6) when pattern-processed thereafter. Also the upper semiconductive layer is formed on the gate insulating film 9, as a continuous film when deposited thereon, and as a combination of predetermined separate patterns (constituting the source electrode 10, the drain electrode 11 and the upper channel 12) when pattern-processed thereafter.

According to the present embodiment, the lower channel 6 has the lower gate electrode 2 disposed thereunder and the intermediate gate electrode 8 disposed thereover, like the upper channel 12 having the intermediate gate electrode 8 disposed thereunder and the upper gate electrode 14 disposed thereover. This double-sandwiched arrangement of channels by gate electrodes permits respective potentials around the gate electrodes to be effectively controlled to thereby prevent an undesirable leakage current that otherwise would develop due to an inherent constitution of TFT including a back channel formed on a floating substrate, and besides a disadvantageous Vth shift that otherwise would develop as interlayer surfacial conditions vary between a channel and an insulating layer or an active polysilicone layer in contact therewith.

FIGS. 8A to 8D illustrate a series of fabrication processes of the thin film transistor device according to the first embodiment.

Figure 8A:
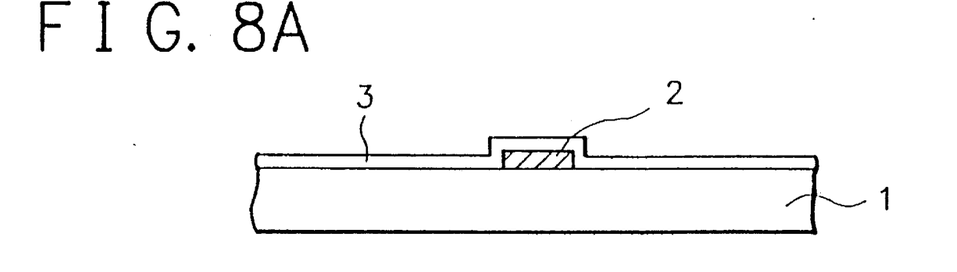
FIGS. 8A to 8D are sectional views describing fabrication processes of the thin film transistor device of FIG. 6.

In a first process after preparation of the insulating substrate 1, this substrate 1 has an n-type or p-type film grown thereon by a CVD (chemical vapor deposit) method to a thickness within a range of 1000Å to 2000Å or a metallic material of a high melting point or a silicide deposited thereon in a spattering manner or the like and pattern-processed thereafter, thereby forming the lower gate electrode 2, and a thin film such as of a silicon oxide or of a silicon nitride deposited thereon by a CVD method to a thickness within a range of 200Å to 1500Å, thereby forming the gate insulating film 3, as shown in FIG. 8A.

Figure 8B:
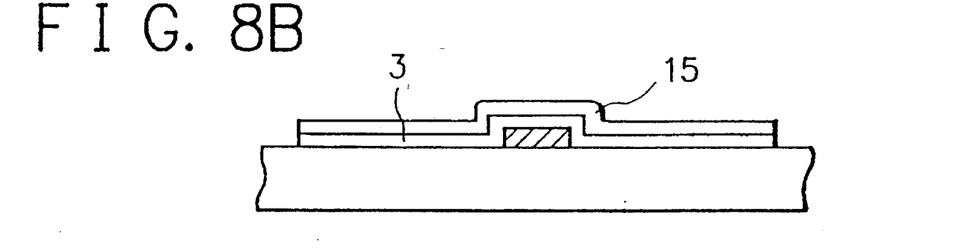
Figure 8C:
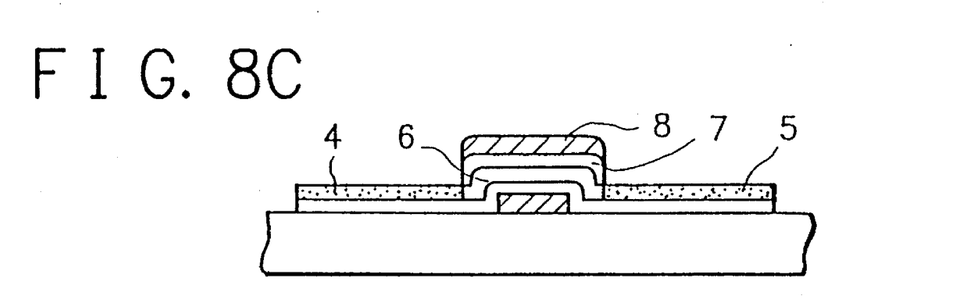

In a second process, a semiconductive layer 15 (as an original of the lower semiconductive layer) is deposited on the gate insulating film 3 by a CVD method to a thickness within a range of 150Å to 1500Å, as shown in FIG. 8B, and pattern-processed to make the patterns corresponding to the source electrode 4, the drain electrode 5 and the lower channel 6, as shown in FIG. 8C.

In a third process, like steps to the first and second processes are employed to form the gate insulating film 7 and the intermediate gate electrode 8, as shown in FIG. 8C. Then, among the patterns made (in the second process) from the semiconductive layer 15, corresponding ones to the source and drain electrodes 4 and 5 are doped with a predetermined quantity of dopant, for example with 1E15 $cm^{-2}$ of ionized boron particles introduced at an energy level between 15 keV to 30 keV, from an unshown ion injector, through a protective oxide film and by making a meritful use of the intermediate gate electrode 8 as a self-adaptive or self-matching masking member, thereby obtaining the source electrode 4 and the drain electrode 5 together with the lower channel 6 left therebetween as a patterned semiconductive region, thus having the lower TFT in a complete form, as shown in FIG. 8C.

In this respect, the intermediate gate electrode 8 may preferably have an overlapping size or offset size with respect to the lower gate electrode 2 to provide the lower TFT with a geometry that permits an overlapping gate structure or offset gate structure to be achieved in a self-matching ion injection method. With an offset gate structure, the lower TFT may have a moderate or suppressed potential developed along an associated drain electrode edge, giving an effectively reduced leakage current and an improved withstand voltage.

Figure 8D:
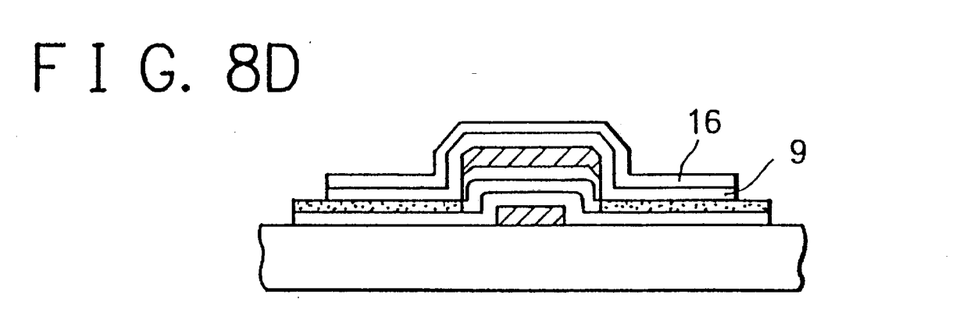

In a fourth process, like steps to the first and second processes are employed to form the gate insulating film 9 and a semiconductive layer 16 (as an original of the upper semiconductive layer), as shown in FIG. 8D, with similar or modified thicknesses to or from specified ones for the first and second processes, before a patterning of the semiconductive layer 16. Then, like the case of the third process, the gate insulating film 13 and the upper gate electrode 14 are formed within the described thickness ranges. Thereafter, among patterns made from the layer 16, corresponding ones to the source and drain electrodes 10 and 11 are doped with a predetermined quantity of dopant, for example with 1E15 $cm^{-2}$ of ionized phosphorus particles introduced at an energy level between 30 keV to 80 keV, from an ion injector, through a protective oxide film and by using the upper gate electrode 14 as a masking member, thereby obtaining the source electrode 10 and the drain electrode 11 together with the upper channel 12 left therebetween as a patterned semiconductive region, thus having the upper TFT in a complete form.

Figure 9:
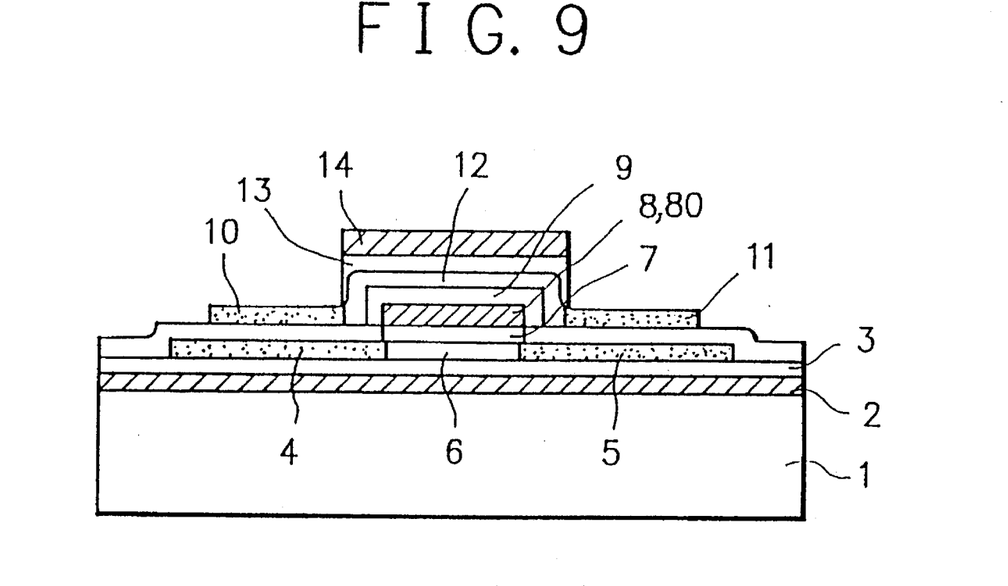
FIG. 9 is a section of a laminated complementary thin film transistor device according to a second embodiment of the present invention.

FIG. 9 illustrates the inner structure of a laminated complementary thin film transistor device according to a second embodiment of the present invention. Like or corresponding parts to the first embodiment are designated at like numerals. For the production, there are employed similar processes to the first example.

The thin film transistor device according to the second embodiment comprises an insulating substrate 1, a lower TFT formed on the substrate 1, and an upper TFT laminated on the lower TFT. The lower TFT comprises a lower gate electrode 2 formed on the substrate 1, as a back gate extending over the transverse length of the latter, a flat gate insulating film 3 formed on the gate electrode 2, a substantially flat lower semiconductive layer formed on the film 3, the semiconductive layer consisting of a source electrode 4, a drain electrode 5 and a lower channel 6, another flat gate insulating film 7 formed on the lower semiconductive layer, and an intermediate gate electrode 8 formed on the film 7, as a top gate of the lower TFT and a common gate to the lower and upper TFTs. The upper TFT comprises the intermediate gate electrode 8 as a back gate thereof, a gate insulating film 9 formed on the gate electrode 8, a centrally raised upper semiconductive layer formed on the films 7 and 9, the semiconductive layer consisting of a source electrode 10, a drain electrode 11 and an upper channel 12, a gate insulating film 13 formed on the upper channel 12, and an upper gate electrode 14 formed on the film 13, as a top gate of the upper TFT. The described structure of the second embodiment provides similar effects to the first embodiment, while having a reduced number of layer raising steps, permitting a patterning process to be once omitted, effectively reducing the total number of fabrication processes.

Figure 10:
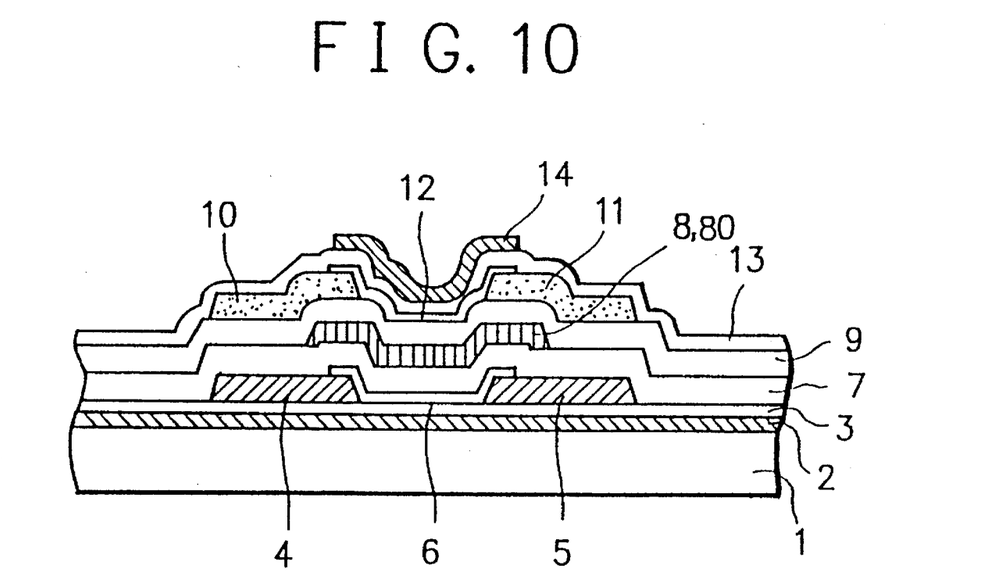
FIG. 10 is a section of a laminated complementary thin film transistor device according to a third embodiment of the present invention.

FIG. 10 illustrates the inner structure of a laminated complementary thin film transistor device according to a third embodiment of the present invention. Like or corresponding parts to the first or second embodiment are designated at like numerals.

The thin film transistor device according to the third embodiment comprises an insulating substrate 1, a lower TFT formed on the substrate 1, and an upper TFT laminated on the lower TFT, while having an inverted trapezoidal intermediate gate electrode 8 employed as a common gate for the lower and upper TFTs. The lower TFT comprises a lower gate electrode 2 formed on the substrate 1, as a back gate extending over the transverse length of the latter, a flat gate insulating film 8 formed on the gate electrode 2, a first lower semiconductive layer formed on the film 3, the first lower semiconductive layer consisting of a source electrode 4 and a drain electrode 5, a second lower semiconductive layer formed on the film 3 between the source and drain electrodes 4 and 5 and on respective peripheral portions of the source and drain electrodes 4 and 5, the second lower semiconductive layer consisting of an inverted trapezoidal lower channel 6, a gate insulating film 7 formed on the first and second lower semiconductive layers, and the intermediate gate electrode 8 formed on the film 7, as a top gate of the lower TFT. The upper TFT comprises the intermediate gate electrode 8 as a top gate thereof, a gate insulating film 9 formed on the gate electrode 8 and the film 7, a first upper semiconductive layer formed on the film 9, the first upper semiconductive layer consisting of a stepped source electrode 10 and a similarly stepped drain electrode 11, a second upper semiconductive layer formed on the film 9 between the source and drain electrodes 10 and 11 and on peripheral portions of the source and drain electrodes 10 and 11, the second upper semiconductive layer consisting of an upper channel 12 having a stepped basin-like transverse section, a gate insulating film 13 formed on the upper channel 12, the source and drain electrodes 10 and 11 and the film 9, and an upper gate electrode 14 formed on the film 13, as a back gate of the upper TFT, the gate electrode 14 having a bowl-like transverse section.

In production of the thin film transistor device according to the third embodiment, the source and drain electrodes 4 and 5 are formed before forming the second lower semiconductive layer. After formation of the lower channel 6, the gate insulating film 7 and the intermediate gate electrode 8 are formed in this order, and then the gate insulating film 9 is formed. Thereafter, the source and drain electrodes 10 and 11 are formed before forming the second upper semiconductive layer. The gate electrodes 2 and 14 employed as a back gate for controlling Vth values in the same or similar manner as or to the first and second embodiments, and further serve as a light shielding film for protecting an associated channel from undesirable incident light. The insulating substrate 1 may be quartz and the lower gate electrode 2 may effectively suppress a leakage current component due to incident light to the lower channel 6. The described structure of the third embodiment permits a TFT lamination to be achieved in a facilitated manner.

In the respective embodiments of the present invention, the lower, intermediate and upper gate electrodes 2, 8 and 14 may have modified configurations and/or arrangements according to intended applications of the thin film transistor device. The intermediate gate electrode 8 interposed between the lower and upper channels 6 and 12 may preferably be employed to drive both lower and upper TFTs, so that the lower and upper gate electrodes 2 and 14 can have substantially fixed potentials developed thereabout, permitting an effective control of channel function free from an undesirable floating effect. Moreover, the lower and upper TFTs may be either driven in a double gated manner to lo secure an enhanced on-state current.

The intermediate gate electrode 8 may be formed as a substantially exclusive top or back gate electrode for the lower TFT, and another intermediate gate electrode may be formed on a gate insulating film on the gate electrode 8 or in parallel with the gate electrode 8, as a substantially exclusive top or back gate electrode for the upper TFT. Likewise, the intermediate gate electrode 8 may be formed as a substantially exclusive top or back gate electrode for the upper TFT, and another intermediate gate electrode may be formed below a gate insulating film under the gate electrode 8 or in parallel with the gate electrode 8, as a substantially exclusive top or back gate electrode for the lower TFT.

A laminated complementary thin film transistor device according to the present invention comprises an insulating substrate, and a plurality of transversely spaced transistor groups formed on the insulating substrate, the transistor groups each respectively consisting of a longitudinally spaced combinations of lower and upper TFTs, while the combinations of TFTs are each respectively formed in accordance with any of the described embodiments or modifications thereof.

According to a genus or species of the present invention, therefore, a laminated complementary thin film transistor employing no back channel is permitted to have a constantly adapted Vth value, in addition to a facilitated fabrication of a laminated structure and an effectively size-reduced circuit integration. Moreover, a TFT laminated structure permits a preset combination of different thicknesses to be employed in various component films and/or layers of n-channel type and p-channel type TFTs, e.g. a semiconductive film including a channel and a gate oxidized film, thereby eliminating conventional complicated solutions in CMOS circuit design such as by varying the device size itself for a required compensation due to inherent differences in response speed between n-channel and p-channel TFTs, and hence an increased number of selective branches in circuit design allows circuit performances to be the more optimized. Further, various ion injection methods such as by an SD ion injection, a channel ion injection and an LDD ion injection are applicable, without an extra masking member, in a selective manner to form an n-channel type TFT and a p-channel type TFT, permitting at least two fabrication steps to be eliminated in comparison with a production process of the integration circuit described as the second conventional example, and besides a new type of offset gate structure is employable, with an effectively reduced number of fabrication steps.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A laminated complementary thin film transistor device comprising:

an insulating substrate (1); and a combination of a lower thin film transistor formed on said insulating substrate and an upper thin film transistor laminated over said lower transistor, said combination of said lower transistor and said upper transistor having:

a lower channel (6), a source electrode (4), and a drain electrode (5) formed in said lower transistor;

an upper channel (12) formed in said upper transistor;

a lower gate electrode (2) formed on said insulating substrate (1) and disposed under said lower channel (6), said lower gate electrode (2) extending beyond the area of said lower channel (6), said source electrode (4), and said drain electrode (5);

an intermediate gate electrode (8) disposed between said lower channel (6) and said upper channel (12); and an upper gate electrode (14) disposed over said upper channel (12).

2. A laminated complementary thin film transistor device comprising:

an insulating substrate (1); and a combination of a lower thin film transistor formed on said insulating substrate and an upper thin film transistor laminated over said lower transistor, said combination of said lower transistor and said upper transistor having:

a lower channel (6) formed in said lower transistor;

an upper channel (12) formed in said upper transistor;

a lower gate electrode (2) disposed under said lower channel (6);

an intermediate gate electrode (8) disposed between said lower channel (6) and said upper channel (12), said intermediate gate electrode (8) being a substantially exclusive gate electrode for said lower transistor, said intermediate gate electrode (8) having a larger width than said lower gate electrode (2);

another intermediate gate electrode (80) formed as a substantially exclusive gate electrode for said upper transistor; and an upper gate electrode (14) disposed over said upper channel (12), said upper gate electrode (14) having a larger width than said another intermediate gate electrode.

3. A laminated complementary thin film transistor device comprising:

an insulating substrate (1); and a combination of a lower thin film transistor formed on said insulating substrate and an upper thin film transistor laminated over said lower transistor, said combination of said lower transistor and said upper transistor having:

a lower channel (6) formed in said lower transistor;

an upper channel (12) formed in said upper transistor;

a lower gate electrode (2) disposed under said lower channel (6);

an intermediate gate electrode (8) having an overlapping area with respect to said lower gate electrode and disposed between said lower channel (6) and said upper channel (12); and an upper gate electrode (14) disposed over said upper channel (12), wherein said lower transistor comprises:

said lower gate electrode (2) being formed on said insulating substrate (1);

a gate insulating film (3) deposited on said lower gate electrode (2) and said insulating substrate (1);

a semiconductive layer (4,5,6) deposited on said gate insulating film (3), said semiconductive layer (4,5,6) including a lower source electrode (4) and a lower drain electrode (5), with said lower channel (6) interposed therebetween;

another gate insulating film (7) formed on said lower channel (6); and said intermediate gate electrode (8) being formed on said another gate insulating film (7).

4. A thin film transistor device as claimed in claim 3, wherein:

said intermediate gate electrode (8) has an overlapping area with respect to said lower gate electrode (2); and said combination of said lower transistor and said upper transistor includes another intermediate gate electrode (80) having an offset area with respect to said lower gate electrode (2).

5. A thin film transistor device as claimed in claim 3 wherein said upper gate electrode has an overlapping area with respect to said intermediate gate electrode.

6. A thin film transistor device as claimed in claim 4 wherein said intermediate gate electrode (80) is formed on a gate insulating film on the gate electrode (8).

7. A laminated complementary thin film transistor device comprising:

an insulating substrate (1); and a combination of a lower thin film transistor formed on said insulating substrate and an upper thin film transistor laminated over said lower transistor, said combination of said lower transistor and said upper transistor having:

a lower channel (6) formed in said lower transistor;

an upper channel (12) formed in said upper transistor;

a lower gate electrode (2) disposed under said lower channel (6);

an intermediate gate electrode (8) disposed between said lower channel (6) and said upper channel (12); and an upper gate electrode (14) having an overlapping area with respect to said intermediate gate electrode disposed over said upper channel (12), wherein said lower transistor comprises:

said intermediate gate electrode (8);

a gate insulating film (9) deposited on said intermediate gate electrode (8) and said lower transistor;

a semiconductive layer (10,11,12) deposited on said gate insulating film (9), said semiconductive layer (10,11,12) including an upper source electrode (10) and an upper drain electrode (11), with said upper channel (12) interposed therebetween;

another gate insulating film (13) formed on said upper channel (12); and said upper gate electrode (14) being formed on said another gate insulating film (13).

8. A thin film transistor device as claimed in claim 7, wherein:

said upper gate electrode (14) has an overlapping area with respect to said intermediate gate electrode (8); and said combination of said lower transistor and said upper transistor includes another intermediate gate electrode (80) having an offset area relative to said upper gate electrode (14).

9. A thin film transistor device as claimed in claim 8 wherein said upper gate electrode has an overlapping area with respect to said intermediate gate electrode.

10. A thin film transistor device as claimed in claim 9 wherein said intermediate gate electrode (80) is formed on a gate insulating film on the gate electrode (8).

* * * * *